US00RE45702E

(19) United States
(12) Reissued Patent
Omi et al.

(10) Patent Number: US RE45,702 E
(45) Date of Reissued Patent: Sep. 29, 2015

(54) SEMICONDUCTOR DEVICE AND MANUFACTURING METHOD FOR SILICON OXYNITRIDE FILM

(71) Applicants: Tadahiro Omi, Osaka (JP); Sharp Kabushiki Kaisha, Osaka (JP)

(72) Inventors: Tadahiro Omi, Sendai (JP); Naoki Ueda, Nara (JP)

(73) Assignees: Tadahiro Omi, Miyagi (JP); SHARP KABUSHIKI KAISHA, Osaka (JP)

(21) Appl. No.: 13/944,442

(22) Filed: Jul. 17, 2013

Related U.S. Patent Documents

Reissue of:
(64) Patent No.: 8,183,647
Issued: May 22, 2012
Appl. No.: 10/732,511
Filed: Dec. 11, 2003

(30) Foreign Application Priority Data

Dec. 12, 2002 (JP) ..... 2002-360865

(51) Int. Cl.

| | |
|---|---|
| ***H01L 29/76*** | (2006.01) |
| ***H01L 21/28*** | (2006.01) |
| ***H01L 29/423*** | (2006.01) |
| ***H01L 29/51*** | (2006.01) |
| ***H01L 29/66*** | (2006.01) |
| ***H01L 29/78*** | (2006.01) |

(52) U.S. Cl.
CPC .... *H01L 21/28202* (2013.01); *H01L 29/42368* (2013.01); *H01L 29/518* (2013.01); *H01L 29/66666* (2013.01); *H01L 29/7827* (2013.01)

(58) Field of Classification Search
CPC ..... H01L 21/28202; H01L 29/42368; H01L 29/518; H01L 29/66666; H01L 29/7827
USPC ..... 257/327, 192, 653, 411
See application file for complete search history.

(56) References Cited

U.S. PATENT DOCUMENTS

| | | | | |
|---|---|---|---|---|
| 4,116,720 | A * | 9/1978 | Vinson | 438/239 |
| 4,119,996 | A * | 10/1978 | Jhabvala | 257/334 |
| 4,225,879 | A * | 9/1980 | Vinson | 257/302 |
| 4,233,617 | A * | 11/1980 | Klaassen et al. | 257/331 |
| 4,272,302 | A * | 6/1981 | Jhabvala | 438/271 |
| 4,455,740 | A * | 6/1984 | Iwai | 438/270 |
| 4,914,058 | A * | 4/1990 | Blanchard | 438/270 |
| 6,395,604 | B1 * | 5/2002 | Kubo et al. | 438/270 |
| 6,551,948 | B2 * | 4/2003 | Ohmi et al. | 438/778 |
| 6,777,745 | B2 * | 8/2004 | Hshieh et al. | 257/330 |
| 2004/0042307 | A1 * | 3/2004 | Ohmi et al. | 365/212 |
| 2004/0102052 | A1 * | 5/2004 | Ohmi et al. | 438/765 |
| 2005/0001547 | A1 * | 1/2005 | Yamazaki et al. | 313/512 |

FOREIGN PATENT DOCUMENTS

| | | |
|---|---|---|
| JP | 5-102480 | 4/1993 |
| JP | 05-102480 | 4/1993 |

(Continued)

*Primary Examiner* — Deandra Hughes
(74) *Attorney, Agent, or Firm* — Nixon & Vanderhye PC

(57) ABSTRACT

The present invention provides a semiconductor device comprising: a silicon based semiconductor substrate provided with a step including an non-horizontal surface, a horizontal surface and a connection region for connecting the non-horizontal surface and the horizontal surface; a gate insulating film formed in at least a part of the step; and a gate electrode formed on the gate insulating film, wherein the entirety or a part of the gate insulating film is formed of a silicon oxynitride film that contains a rare gas element at a area density of $10^{10}$ $cm^{-2}$ or more in at least a part of the silicon oxynitride film.

10 Claims, 18 Drawing Sheets

(56) References Cited

FOREIGN PATENT DOCUMENTS

| | | |
|---|---|---|
| JP | 05-109984 | 4/1993 |
| JP | 11-031815 | 2/1999 |
| JP | 2001-160555 | 6/2001 |
| JP | 2002-261091 | 9/2002 |

* cited by examiner

Kr/$O_2$ plasma 400 °C

Dry $O_2$ 900 °C

SEMICONDUCTOR DEVICE AND MANUFACTURING METHOD FOR SILICON OXYNITRIDE FILM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is related to Japanese application No. 2002-360865 filed on Dec. 12, 2002, whose priority is claimed under 35 USC §119, the disclosure of which is incorporated by reference in its entirety.

BACKGROUND OF THE INVENTION

1. Field of the Invention

The present invention relates to a semiconductor device and a manufacturing method for a silicon oxynitride film. More specifically, the present invention relates to a semiconductor device such as a MOS transistor which is formed on a semiconductor substrate having a three dimensional structure, and a manufacturing method for a silicon oxynitride film.

2. Description of the Related Art

Semiconductor devices such as MOS transistors and memory cells have been miniaturized according to the scaling rule proposed by J. R. Brews for the purpose of implementation of high integration. However, there are great problems that occur in actual devices as miniaturization progresses, such as an increase in a leak current due to reduction in the thickness of a tunnel insulating film, an increase in a diffusion resistance due to reduction in junction depth Xj of source/drain diffusion layers, occurrence of short channel effect, and reduction in the withstand voltage against punch through between sources and drains.

In order to solve such problems, there have been proposed three dimensional semiconductor devices wherein semiconductor substrates are processed into three dimensional forms so as to secure effective dimensions of the elements while reducing the projection areas of the devices. It is explained by FIG. 32 that a technique of utilizing a structure had a trench formed in a semiconductor substrate to work as a channel of a MOS transistor and described in Japanese Unexamined Patent Publication No. HEI 5(1993)-102480 as an example of the above-described conventional art.

The MOS transistor of FIG. 32 has a gate oxide film 20 on the surface of a trench (0.4 to 0.6 μm in depth) in a first conductive type silicon substrate 1 and a gate electrode material is filled into the trench via a gate oxide film 20, whereby a trench type gate 6 is formed. Furthermore, a second conductive type source 8 and a drain 9 are formed on both sides of the trench type gate 6. At least one of the source 8 and the drain 9 is adjacent to a first conductive type impurity region 10 in the direction of the depth of the substrate. The first conductive type impurity region 10 has an impurity concentration higher than that of the silicon substrate 1. At least a part of the channel region of this MOS transistor is formed in the part other than the first conductive type impurity region 10.

With the above-described configuration, it is possible to expand the channel region in the direction of the depth of the semiconductor substrate. Furthermore, the area where the gate electrode is arranged can be reduced while preventing the reduction in a threshold voltage due to a short channel effect and deterioration of an off current. In addition, a depletion layer can be suppressed from extending from the source 8 and the drain 9 so as to increase the withstand voltage against punch through.

The sides of the trench (non-horizontal surfaces) correspond to a (110) plane of the silicon substrate, the connection regions where the sides of the trench make contact with the bottom correspond to a (111) plane, and the bottom of the trench (horizontal surface) corresponds to a (100) plane in the above-described structure. Herein, the gate oxide film is formed according to a thermal oxidation method and, in such a case, it is known that more interface levels exist between the silicon substrate and the gate oxide film in the (110) and (111) planes than in the (100) plane. Therefore, the interface levels that exist in the sides and in the connection regions significantly affect the characteristics of the semiconductor device such that they make lower mobility of carriers and they make a threshold voltage fluctuate.

In addition, it is known that the oxidation rate of the (110) plane, which is the sides of the trench, is 30 to 100% higher than that of the (100) plane on the bottom. Therefore, a problem arises wherein the inversion voltage of the channel region increases when the thickness of the gate oxide film on the sides of the trench increases, leading to the reduction of the driving performance of the MOS transistor.

Furthermore, there is a problem with the reliability of the gate oxide film in the (111) plane of the connection regions wherein an insulation breakage electrical field is lower than that in the (100) plane on the bottom.

In addition, according to the conventional thermal oxidation method, the closer to the right angle the angle (i.e., the angle between the sides and the bottom) in the crossing portion (connection region) of the surfaces of the silicon substrate having different plane directions is the more significant is the reduction in the film thickness of the gate oxide film formed in the crossing portion. Therefore, it is necessary to increase the curvature of the crossing portion and to make the angle between the sides and the horizontal surface greater than 90°. As a result, the projection area of the crossing portion increases; therefore, the dimensions of the semiconductor device increase and the integration of the devices throughout the LSI is decreased.

SUMMARY OF THE INVENTION

The present invention provides a semiconductor device comprising: a silicon based semiconductor substrate provided with a step including an non-horizontal surface, a horizontal surface and a connection region for connecting the non-horizontal surface and the horizontal surface; a gate insulating film formed in at least a part of the step; and a gate electrode formed on the gate insulating film, wherein the entirety or a part of the gate insulating film is formed of a silicon oxynitride film that contains a rare gas element at a area density of $10^{10}$ $cm^{-2}$ or more in at least a part of the silicon oxynitride film.

The present invention also provides a manufacturing method for a silicon oxynitride film, comprising exciting plasma in an atmosphere that contains a gas including nitrogen atoms in molecules, oxygen and a rare gas, thereby forming a silicon oxynitride film that contains a rare gas element at a area density of $10^{10}$ $cm^{-2}$ or more on a silicon based semiconductor substrate provided with a step including an non-horizontal surface, a horizontal surface and a connection region for connecting the non-horizontal surface and the horizontal surface.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
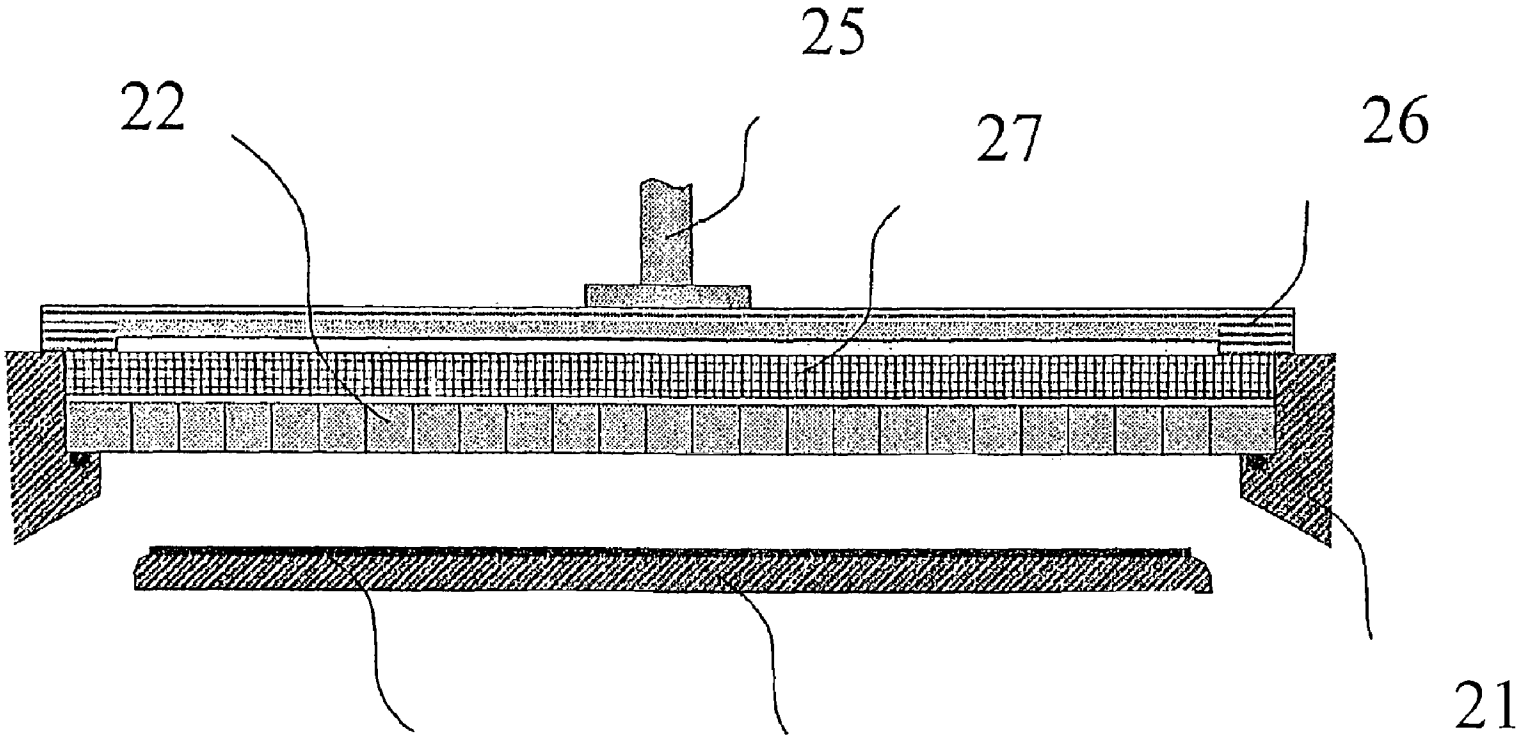
FIG. 1 is a schematic view of a plasma unit using a radial line slot antenna.

The present invention provides a semiconductor device comprising: a silicon based semiconductor substrate provided with a step including an non-horizontal surface, a horizontal surface and a connection region for connecting the non-horizontal surface and the horizontal surface; a gate insulating film formed in at least a part of the step; and a gate electrode formed on the gate insulating film. Furthermore, the entirety or a part of the gate insulating film is formed of a silicon oxynitride film that contains a rare gas element at a area density of $10^{10}$ $cm^{-2}$ or more in at least a part of the silicon oxynitride film.

The silicon based semiconductor substrate that can be utilized in the present invention is not in particular limited, and examples thereof include a silicon substrate, a silicon germanium substrate and the like. It is preferable for the silicon based semiconductor substrate to have p or n conductive type. Examples of impurities for providing the p conductive type include boron, boron fluoride and the like, and examples of impurities for providing n conductive type include phosphorous, arsenic and the like.

The semiconductor substrate is provided with a step including the non-horizontal surface, the horizontal surface and the connection region for connecting the non-horizontal surface and the horizontal surface. The sides of the step correspond to a pair of non-horizontal surfaces, the bottom thereof corresponds to the horizontal surface and the regions between the sides and the bottom correspond to a pair of connection regions, for example, in the case of a trench. Furthermore, in general, the non-horizontal surface corresponds to a (110) plane of the substrate, the connection regions correspond to a (111) plane and the horizontal surface corresponds to a (100) plane in the case of a silicon based semiconductor substrate. It is noted that examples of the step other than the trench include a wall form, a pillar form and the like.

Although the height of the step is not in particular limited, 0.1 to 0.5 μm is preferable. In addition, in the case where the step is formed using a trench, it is preferable for the width of the trench to be the minimum width that can be formed according to the micro-fabrication technique. Furthermore, it is preferable for the width of the connection region projected onto a horizontal surface to be ⅓ to 1/10 of the minimum width that can be formed according to the micro-fabrication technique while it is preferable for the width of the connection region projected onto a surface that is perpendicular to the horizontal surface to be ⅓ to 1/10 of the minimum width that can be formed according to the micro-fabrication technique.

According to the present invention, a gate insulating film is formed on at least a part of the step. According to the present invention, the gate insulating film includes the silicon oxynitride film that contains a rare gas element at a area density of $10^{10}$ $cm^{-2}$ or more in at least a part of the gate insulating film.

Herein, the gate insulating film is not particularly limited as long as it is formed on at least a part of the step, and can be formed: solely on the non-horizontal surfaces, the connection regions or the horizontal surfaces; or on both sides of the non-horizontal surfaces and the connection regions, on both sides of the connection regions and horizontal surfaces, or on the entire surface of the step. It is preferable to form the gate insulating film on the entire surface of the step from among the above because the formation process can be simplified.

Furthermore, the entirety or a part of the gate insulating film is formed of the silicon oxynitride film, and examples of the gate insulating film other than the silicon oxynitride film include a silicon oxide film, a silicon nitride film and the like. In addition, it is preferable for the silicon oxynitride film to be formed at a position so as to make contact with at least the gate electrode.

In addition, the rare gas element may be included in at least a part of the silicon oxynitride film and may be included in the entire surface of the silicon oxynitride film. Herein, it is preferable for the rare gas element to be Kr or Ar from the point of view of the radical generation efficiency that contributes to oxynitridation. In the case where the area density of the rare gas element is less than $10^{10}$ $cm^{-2}$, stoichiometry composition of the silicon oxynitride film is far from the ideal composition and the generation rate of the silicon oxynitride film is lowered to a great degree restricting the desired performance from being exercised, and therefore, such a case is not preferable. More preferable area density is $10^{10}$ $cm^{-2}$ or more. It is noted that the area density is measured by means of a secondary ion mass spectrometer (SIMS) and can be set at a predetermined value by adjusting the manufacturing conditions such as flow amount of the rare gas, DC bias, RF power and degree of vacuum.

An example of a method for forming the silicon oxynitride film that includes a rare gas element includes a method for directly and simultaneously oxidizing and nitriding Si atoms that form the silicon based semiconductor substrate in an atmosphere that includes, for example, nitrogen gas or a compound gas containing nitrogen atoms, oxygen gas and a rare gas. In particular, it is preferable to carry out oxidation and nitridation while exciting plasma by means of microwaves.

The method of exciting plasma by microwaves is not particularly limited as long as the microwaves can be introduced into a process chamber and examples thereof include known methods, for example, a plasma unit that uses a radial line slot antenna.

In addition, examples of the compound gas containing nitrogen atoms include $NH_3$ and the like.

In the case where the rare gas is Kr and the compound gas containing nitrogen atoms is $NH_3$, it is preferable for the flow ratio of the respective gases in the atmosphere to be 89 to 99%/0.1 to 10%/1 to 10% ($Kr/NH_3/O_2$).

It is preferable for the frequency of the microwaves being used to be in the range from 900 MHz or more to 10 GHz or less.

In particular, it is preferable to form the silicon oxynitride film by using a high density plasma excited by microwaves when the low substrate temperature is at 550° C. or less (e.g., 200 to 550° C.). That is, a single species of O radicals, a mixture of O radicals and NH radicals, or a mixed nitriding species of O radicals, N radicals and H radicals are provided to the silicon based semiconductor substrate so as to oxynitride silicon, so that a thin silicon oxynitride film, having silicon-insulating film interface characteristics and current leak-proof characteristics equal to or better than those of the silicon oxide film formed by means of known thermal oxidation and having excellent charge-to-breakdown characteristics, can be formed at a temperature as low as 550° C. or less (e.g., 400 to 500° C.). Roughness of the interface between the silicon based semiconductor substrate and the silicon oxynitride film can be greatly reduced by forming the silicon oxynitride film according to the above-described method, so that the electron mobility in the surface of the silicon based semiconductor substrate can be greatly increased.

It is possible to change, in the depth direction, the oxygen concentration peak and/or nitrogen concentration peak in the silicon oxynitride film by changing the flow ratio of nitrogen gas or the compound gas containing nitrogen atoms to oxygen gas during the formation of the silicon oxynitride film.

Next, a gate electrode is formed on the gate insulating film. Examples of the gate electrode include metal layers such as of aluminum or copper, polysilicon layers, silicide layers such as of high melting point metals (titanium, tungsten or the like), laminations of these, and the like. In addition, the gate electrode may cover the entire surface of the step or may cover a part of the gate insulating film as long as it is positioned on the gate insulating film.

Figure 33:
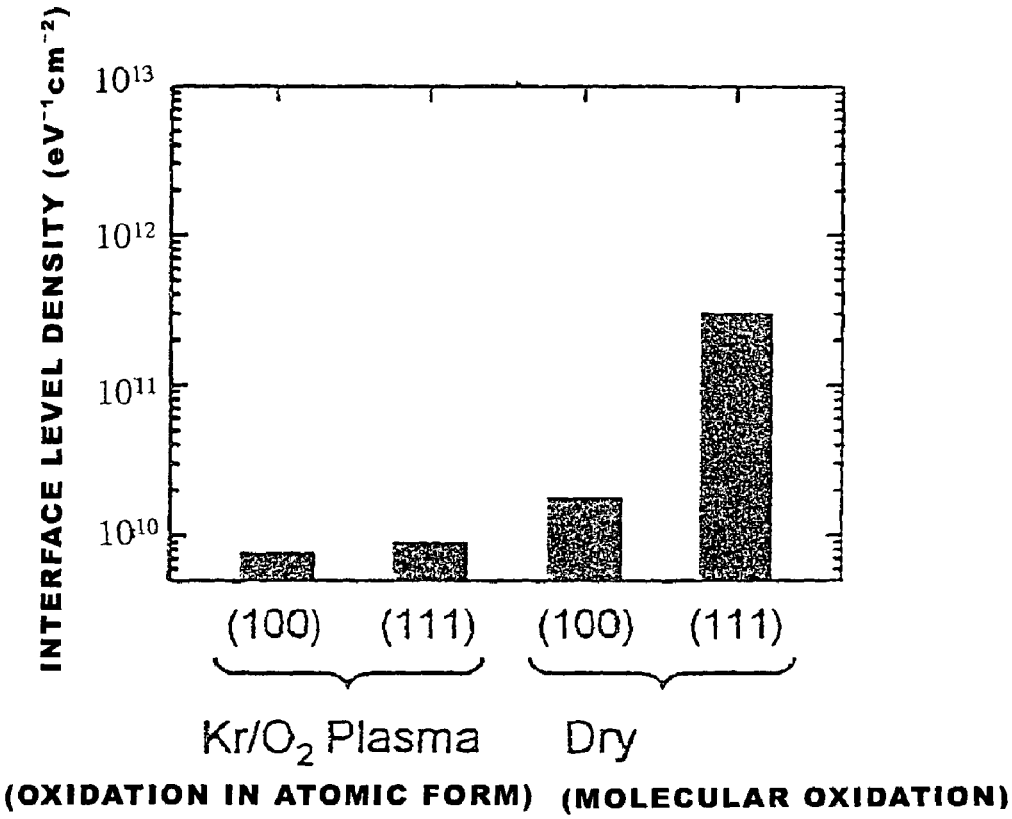
FIG. 33 is a graph, showing plane direction dependencies of interface level densities by a radical oxynitriding for a semiconductor device of the present invention and thermal oxidation.

The silicon oxynitride film is formed into a gate insulating film according to the above-described technique, so that the interface level density of the (111) plane (approximately the same as the non-horizontal surface) in the plane direction of the silicon based semiconductor substrate in the connection region can be greatly reduced in comparison with a conventional thermal oxidation method so as to be at approximately the same level as that of the (100) plane at the bottom as shown in FIG. 33. As a result, reduction in the mobility of the carriers in the non-horizontal surface and fluctuation of the threshold voltage in the trap site can be suppressed. It is noted that the interface level density of FIG. 33 has a value that is calculated based on the C-V characteristics of an aluminum gate MOS capacitor.

Figure 34:
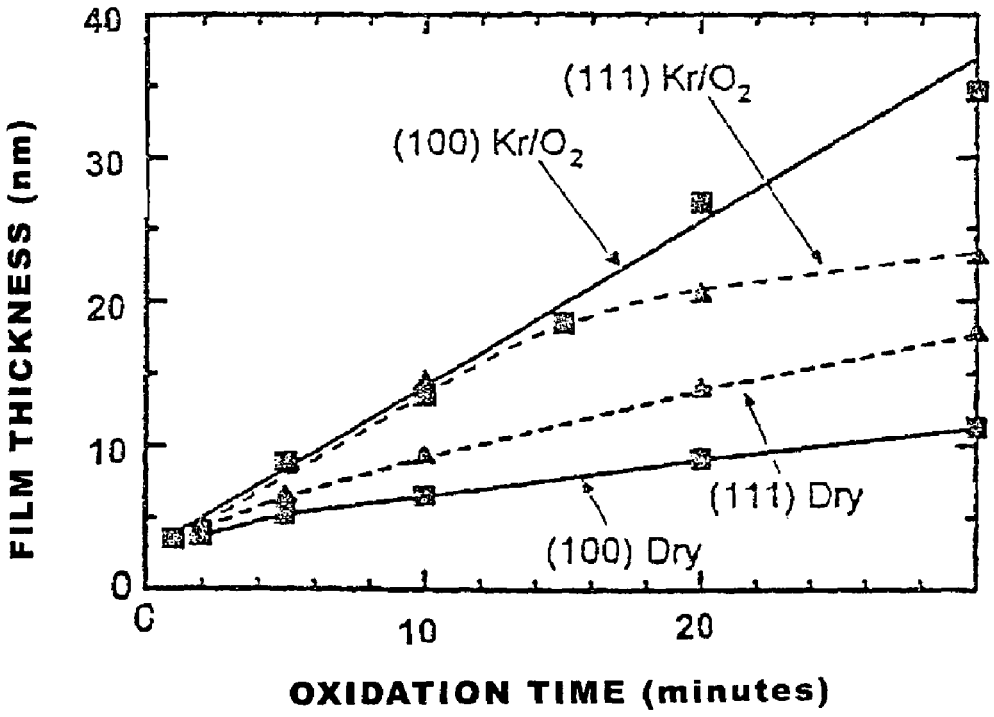
FIG. 34 is a graph showing plane direction dependencies of oxidizing rates by a radical oxynitriding for a semiconductor device of the present invention and thermal oxidation.

In addition, the oxidation rate of the (111) plane (approximately the same as the non-horizontal surface) of the connection region is approximately the same as that of the (100) plane of the horizontal surface until the film thickness becomes of a certain value as shown in FIG. 34. Therefore, an increase in the channel inverting voltage due to the increase in the film thickness of the gate oxide film on the non-horizontal surface can be suppressed so that the driving performance can be enhanced. The measurement of the film thickness in FIG. 34 is carried out by an optical method.

Figure 35:
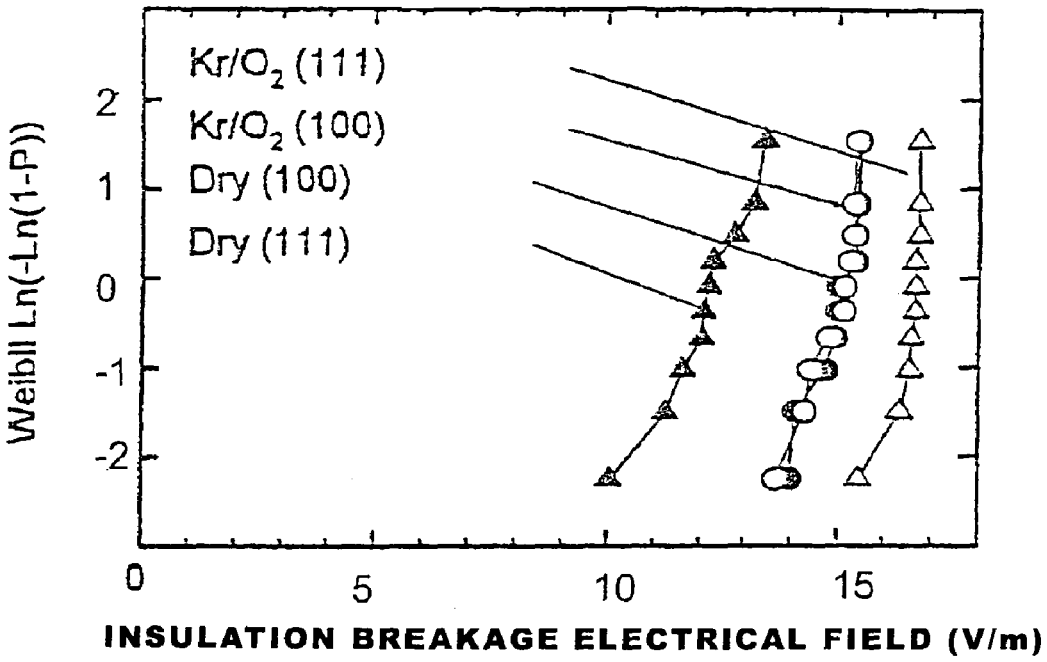
FIG. 35 is a graph showing plane direction dependencies of insulation breakage electrical fields by a radical oxynitriding for a semiconductor device of the present invention and thermal oxidation.

Thus, as shown in FIG. 35, the insulation breakage electrical field in the (111) plane of the connection region increases in comparison with the oxide film according to a thermal oxidation method and the reliability of the gate insulating film can be increased. It is noted that the insulation breakage electrical field of FIG. 35 indicates a value measured on a MOS capacitor having a film thickness of 5 nm using a determination current of 1 $A/cm^2$. In the figure, $Kr/O_2$ indicates the method of the present invention and Dry indicates the conventional thermal oxidation method.

Figure 36A:
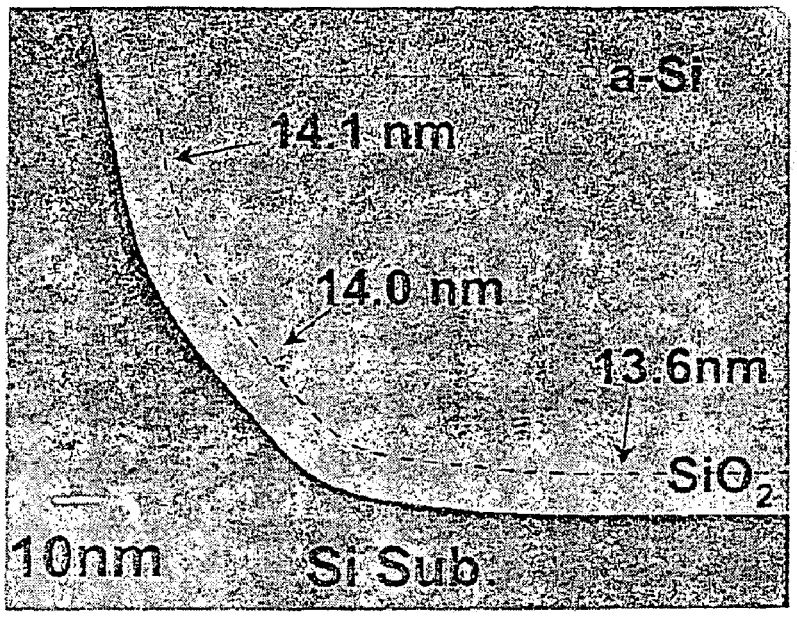
FIGS. 36A and 36B are views of showing cross-sectional TEM photographs of corner portions by a radical oxynitriding for a semiconductor device of the present invention and thermal oxidation.
Figure 36B:
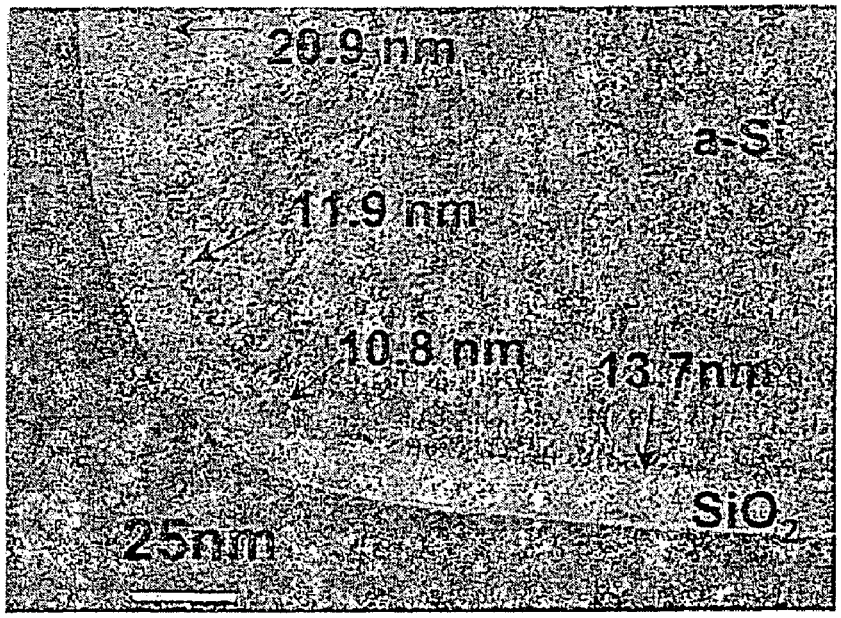
Fig. 36B Prior Art

In addition, as shown in the cross-sectional TEM photographs of FIGS. 36A and 36B, the oxide film (FIG. 36A) in the connection region according to the present invention is uniform in comparison with the oxide film according to a thermal oxidation method (FIG. 36B) and the degree of integration of the LSI can be increased by removing the slopes.

It is noted that the semiconductor device of the present invention is applicable for a MOS transistor or a memory cell wherein the gate electrode and the corresponding channel region include at least a part of the non-horizontal surface.

Embodiment 1

First, a method for forming a silicon oxynitride film at a low temperature using plasma will be described below. FIG. 1 is a schematic cross-sectional view showing one example of a unit using a radial line slot antenna, for forming a silicon oxynitride film.

Kr is utilized as a plasma exciting gas for the formation of a silicon oxynitride film according to the present embodiment. A vacuum container (process chamber) 21 is vacuumed and Kr gas, $NH_3$ gas and $O_2$ gas are introduced from a shower plate 22 to the process chamber wherein the pressure is set at approximately 1 Torr. A substrate 23, in a circular form, such as a silicon wafer is placed on a sample support 24 having a heating mechanism, and setting is carried out so that the temperature of the sample becomes approximately 400° C.

2.45 GHz microwaves are transmitted into the process chamber through a radial line slot antenna 26 and through a dielectric plate 27 from a coaxial wave guide 25, so that high density plasma is generated in the process chamber 21. The distance between the shower plate 22 and the substrate 23 is set at 60 mm. As this distance is reduced, it is possible for the rate of film formation to become higher. The silicon oxynitride film formed in the above-described conditions includes Kr at a area density of $10^{10}$ $cm^{-2}$ or more.

Thus, the inclusion of Kr at a area density of $10^{10}$ $cm^{-2}$ or more contributes to the improvement of electrical characteristics and the reliability of the silicon oxynitride film. Concretely, they are considered to be improved because of the following reasons.

First, nitrogen hydrogen NH* in atom form and oxygen O* in atom form are efficiently generated due to krypton Kr* in atom form that is in intermediate excitation condition in a high density excitation plasma of a mixed gas of Kr, $NH_3$ and $O_2$ (* indicates that it is a radical). These NH radicals nitride the surface of the substrate while the O radicals, simultaneously oxidize the same. It becomes possible, according to the silicon oxynitridation of the present embodiment, to form a high quality silicon oxynitride film at a low temperature in the (100) plane, in the (111) plane and in the (110) plane of silicon, no relation to of the plane direction of silicon.

Furthermore, stress is relieved in the silicon oxynitride film or in the interface between the silicon semiconductor substrate and the silicon oxynitride film; therefore, fixed charge and the interface level density in the silicon oxynitride film are reduced. As a result, electrical characteristics and the reliability are greatly improved.

Embodiment 2

Next, a first embodiment of the semiconductor device (MOS transistor) of the present invention shown in FIG. 9 will be described in detail. Although an example of an NMOS transistor will be described below, a similar embodiment can be obtained by replacing it with a PMOS transistor.

Figure 2:
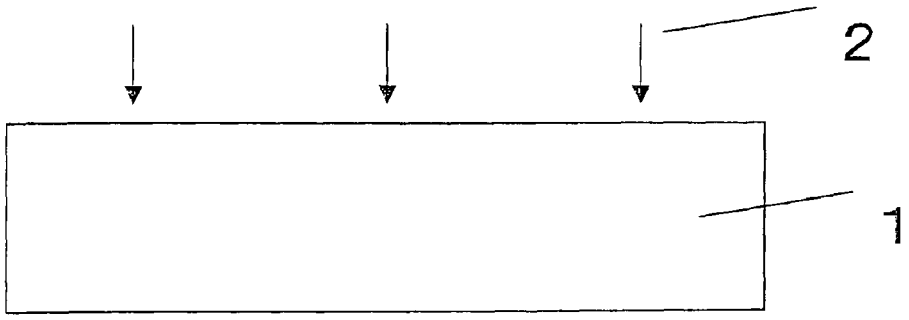
FIGS. 2 to 30 are schematic cross-sectional views showing steps for manufacturing semiconductor devices of the present invention.

First, ion implantation 2 is carried out on silicon substrate 1 under the implantation conditions of 10 to 60 KeV and 5e12 to 5e13 ions/$cm^2$ of, for example, boron or $BF_2$ as shown in FIG. 2.

Figure 3:
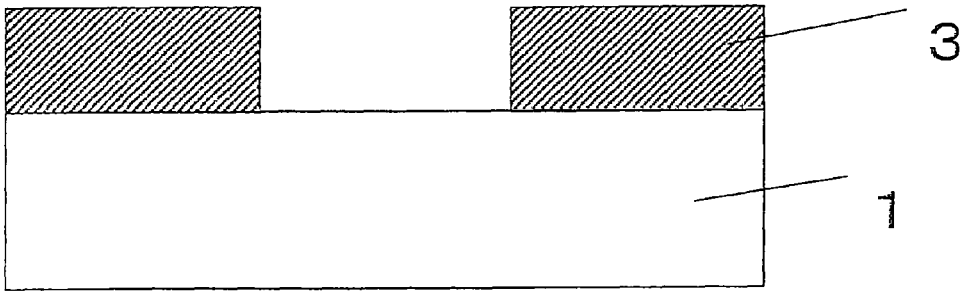

Next, the resist is patterned by using a lithographic technique as shown in FIG. 3 so as to obtain a resist pattern 3.

Figure 4:
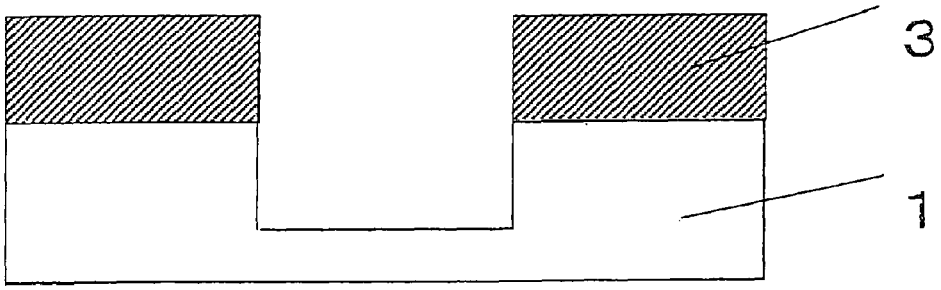

Then, the silicon substrate 1 is removed through etching to the depth of approximately 120 to 500 nm so as to form a trench as shown in FIG. 4. After that, the resist pattern 3 is removed.

Figure 5:
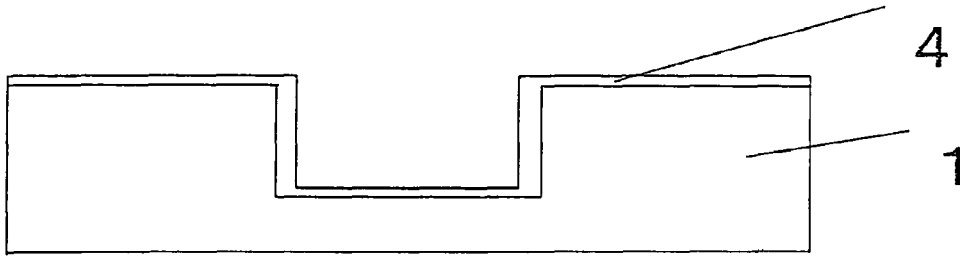

Next, as shown in FIG. 5, a gate oxynitride film (silicon oxynitride film) 4 is formed so as to have a film thickness of approximately 10 to 16 nm according to a method using Kr plasma excited by microwaves in the same manner as in Embodiment 1.

Figure 6:
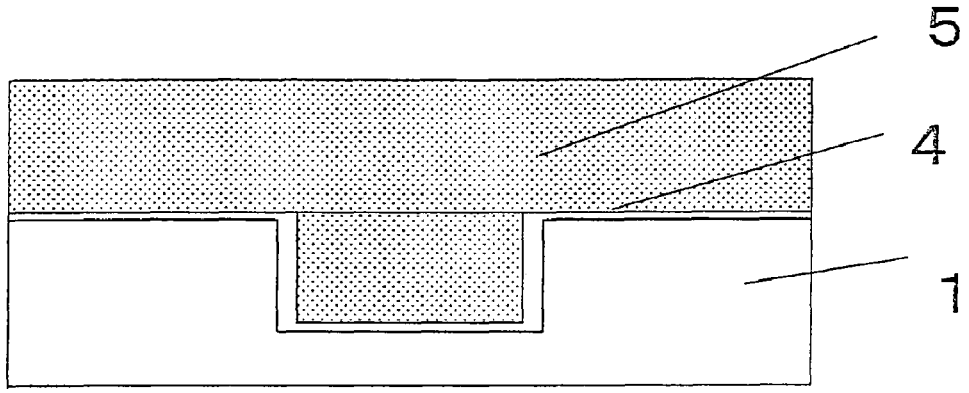
Figure 7:
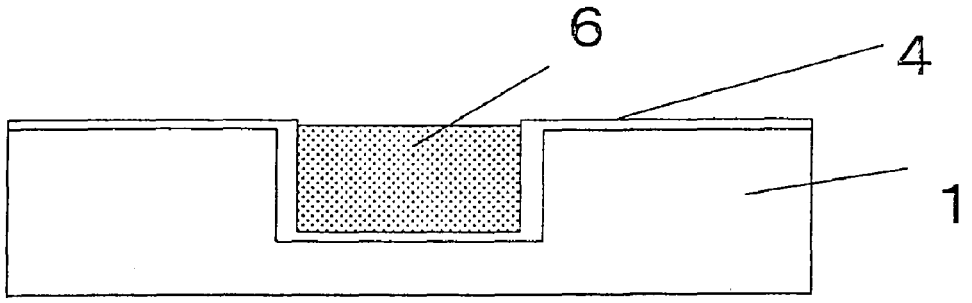

Then, a polysilicon layer 5 is filled into the trench as shown in FIG. 6. Furthermore, etching back is carried out until the corners of the top portion of the trench are completely exposed, thereby forming a trench-type gate 6 as shown in FIG. 7.

Figure 8:
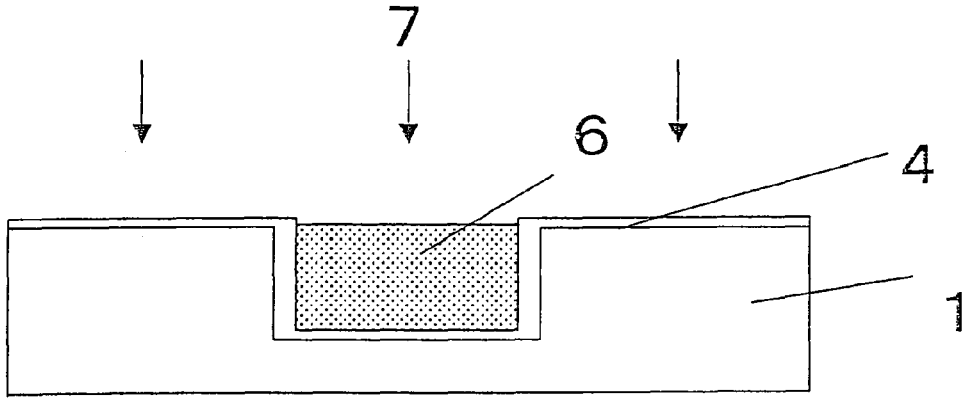

After that, ion implantation 7 is carried out under the conditions of 5 to 40 KeV, 1e14 to 1 e16 ions/$cm^2$ of, for example, arsenic, as shown in FIG. 8.

Figure 9:
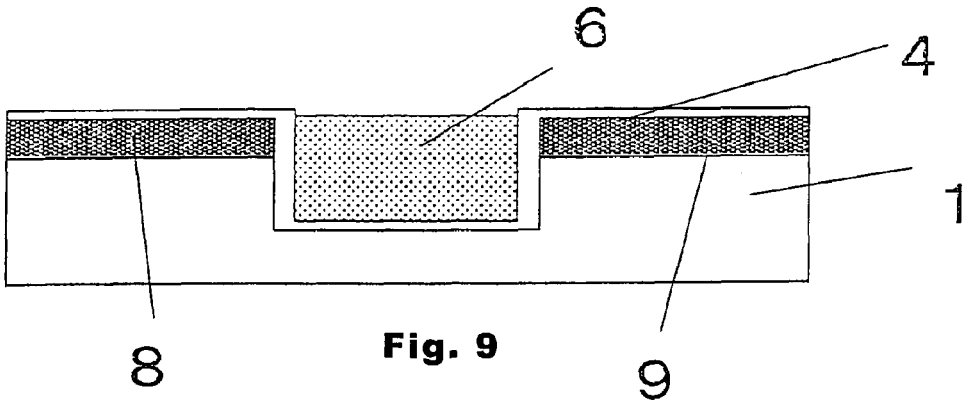

Next, annealing is carried out at 800 to 900° C. for the purpose of recovering crystal in the implantation regions, driving in and activating the implanted impurities, thereby forming a source 8 and a drain 9 as shown in FIG. 9. The NMOS transistor of the present invention is manufactured according to the above-described process.

Embodiment 3

A second embodiment of the semiconductor device (MOS transistor) of the present invention will be described below in detail. Although an example of an NMOS transistor will be described below, a similar example can be obtained by replacing it with a PMOS transistor.

Figure 10:
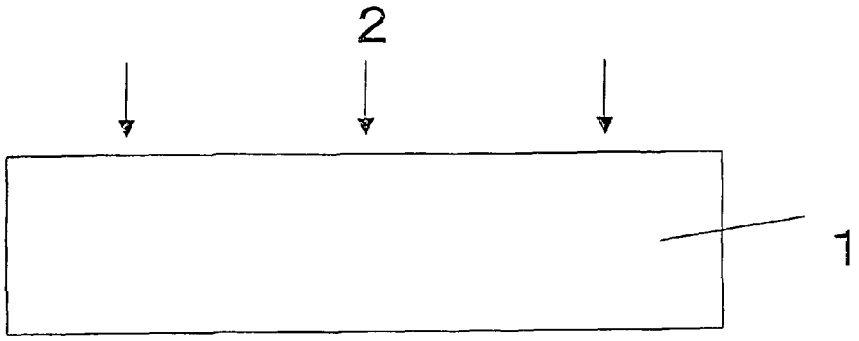

First, the ion implantation 2 is carried out on the silicon substrate 1 under the implantation conditions of 10 to 60 KeV and 5e12 to 5e13 ions/$cm^2$ of, for example, boron or $BF_2$ as shown in FIG. 10.

Figure 11:
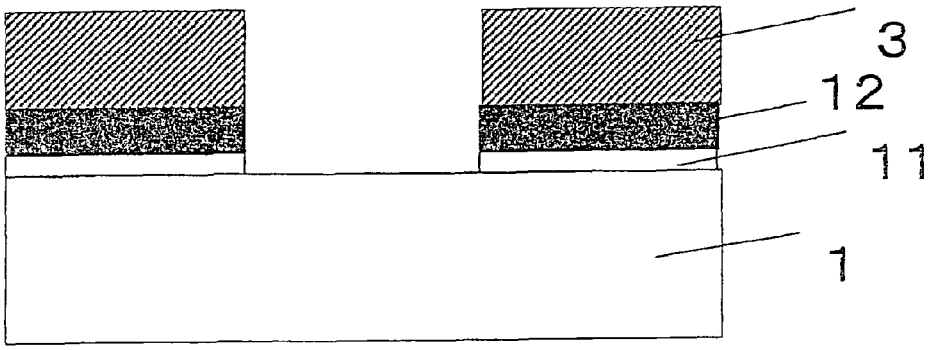

Next, a silicon oxide film 11 and a silicon nitride film 12 are formed on the silicon substrate 1 as mask materials at the time of etching the silicon substrate 1. Furthermore, the silicon nitride film 12 and the silicon oxide film 11 are patterned using the resist pattern 3 (FIG. 11).

Figure 12:
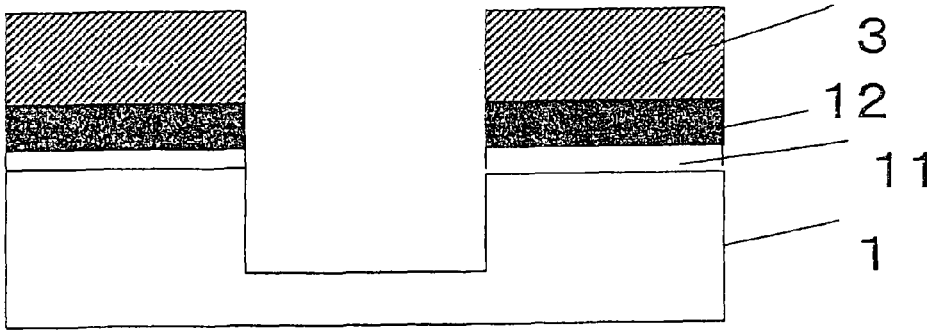

Next, a trench is formed by removing the silicon substrate 1 through etching to a depth of approximately 120 to 500 nm as shown in FIG. 12. After that, the resist pattern 3 is removed.

Figure 13:
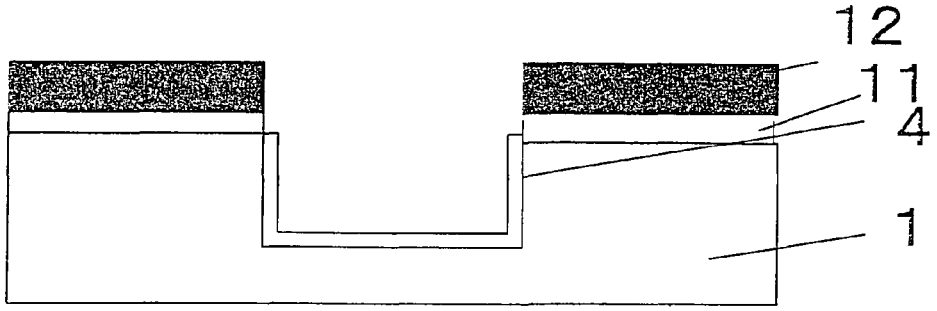

Then, the gate oxynitride film (silicon oxynitride film) 4 is formed by means of oxynitridation of silicon using the above-described Kr plasma excited by microwaves so as to have a film thickness of approximately 10 to 16 nm as shown in FIG. 13. This silicon oxynitride film 4 includes Kr at a area density of $10^{10}$ $cm^{-2}$ or more.

Figure 14:
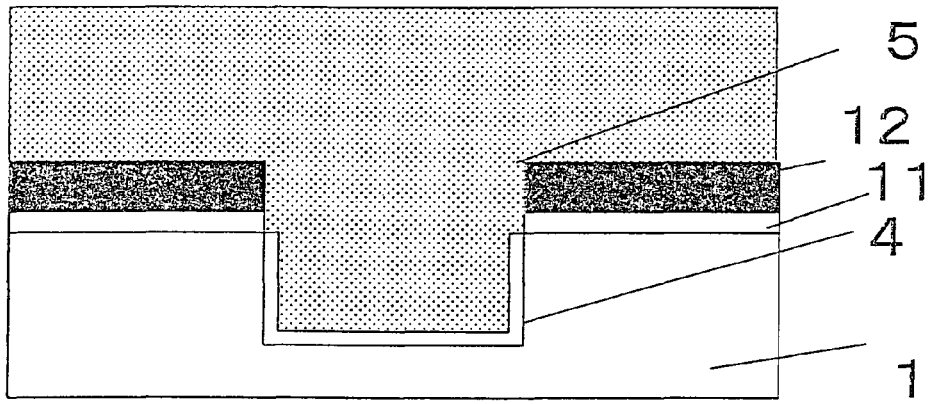

Next, the polysilicon layer 5 is filled into the trench as shown in FIG. 14.

Figure 15:
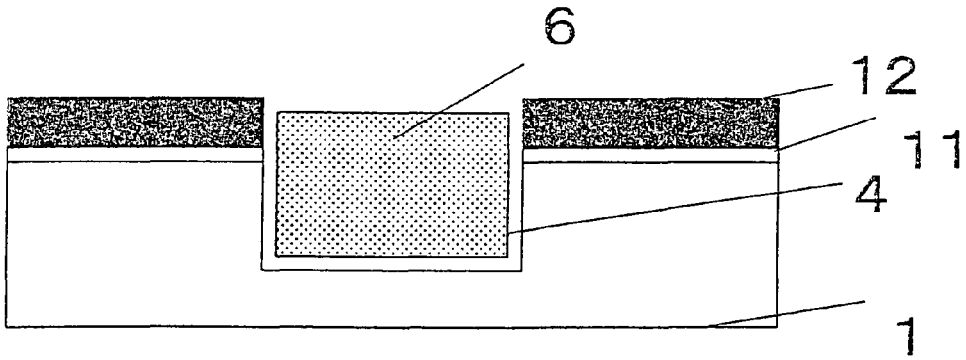

Then, etching back is carried out until the surface of the above-described mask materials are completely exposed, so that the trench type gate 6 is formed as shown in FIG. 15. After that, the silicon nitride film 12, which is a part of the mask materials, is removed.

Figure 16:
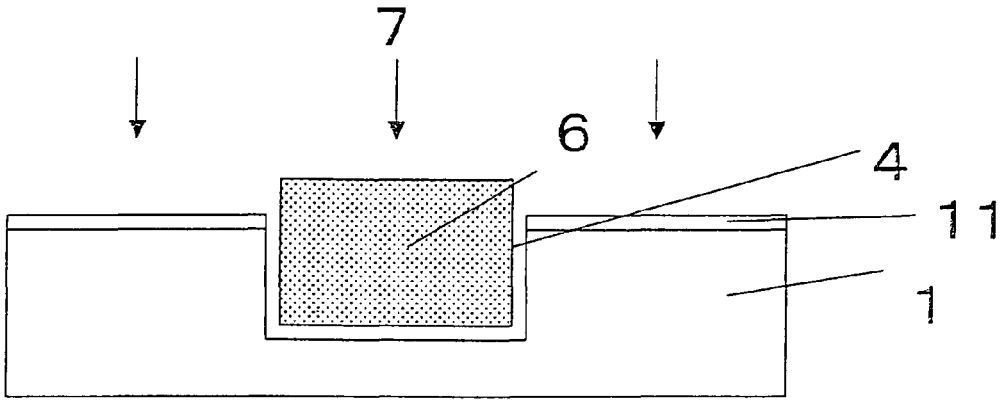

After that, as shown in FIG. 16, ion implantation 7 is carried out under the implantation conditions of 5 to 40 KeV and 1e14 to 1e16 ions/$cm^2$ of, for example, arsenic.

Figure 17:
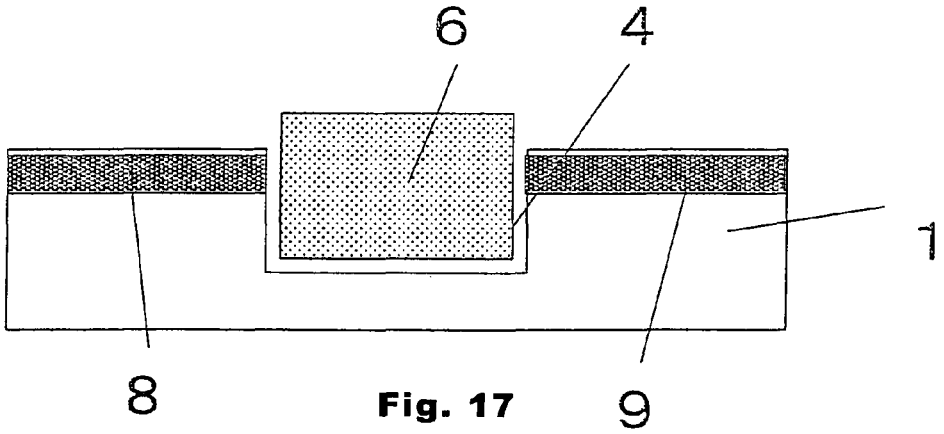

Next, annealing is carried out at 800 to 900° C. for the purpose of recovering crystal in the implantation regions, driving in and activating the implanted impurities, thereby forming the source 8 and the drain 9 as shown in FIG. 17. The MOS transistor of the present invention is manufactured in accordance with the above-described process.

Embodiment 4

Figure 24:
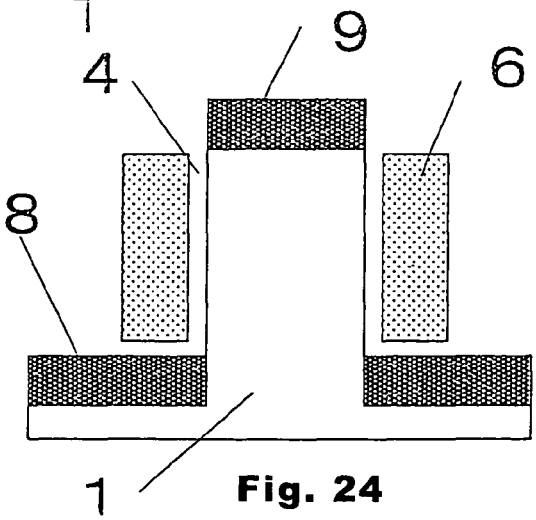

A third embodiment of the semiconductor device (MOS transistor) of the present invention will be described in detail concerning the case where the non-horizontal surface of the silicon substrate shown in FIG. 24 is utilized as a channel. Although an example of an NMOS transistor will be described below, a similar example can be obtained by replacing it with a PMOS transistor.

Figure 18:
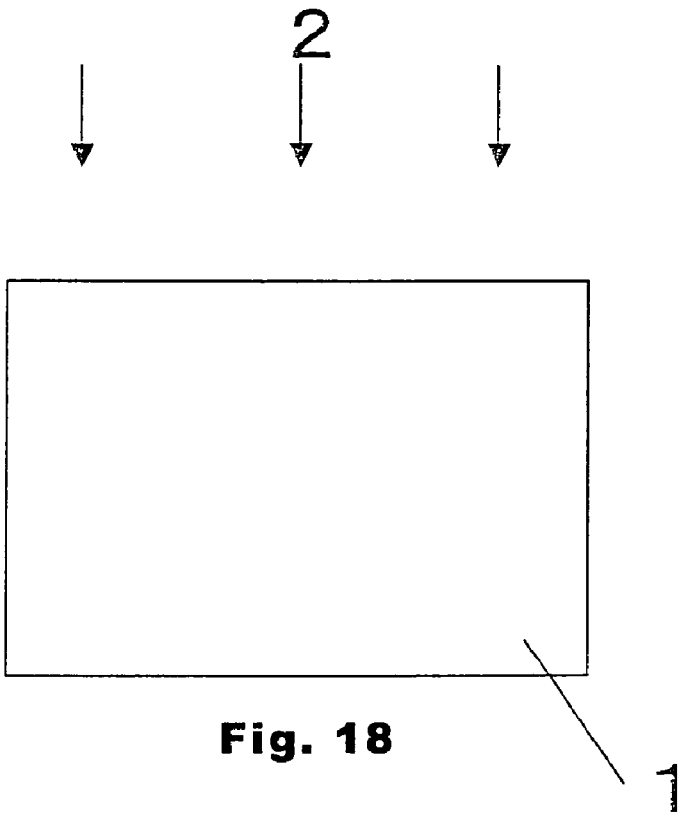

First, the ion implantation 2 is carried out on the silicon substrate 1 under the implantation conditions of 10 to 60 KeV and 5e12 to 5e13 ions/$cm^2$ of, for example, boron or $BF_2$ as shown in FIG. 18.

Figure 19:
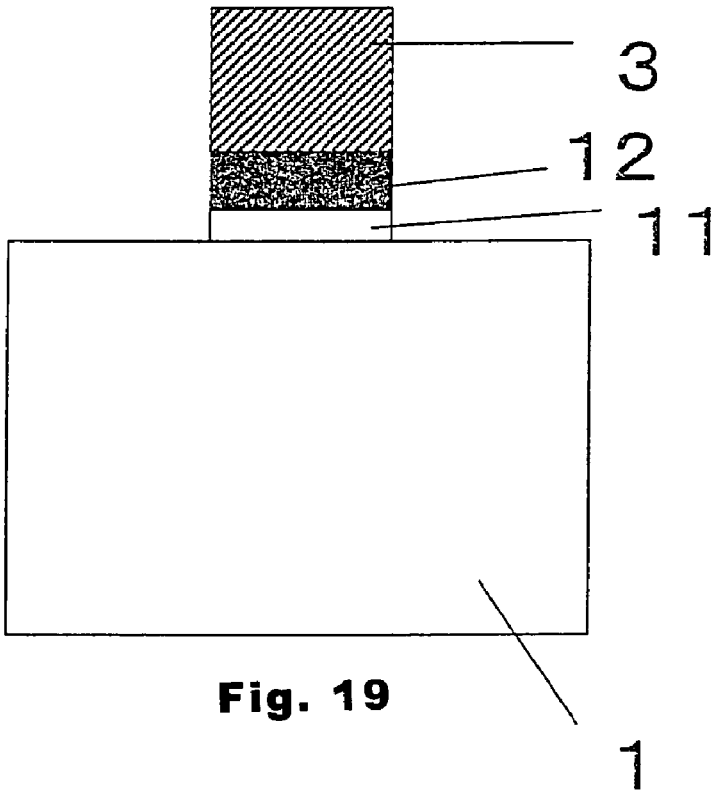

Next, the silicon oxide film 11 and the silicon nitride film 12 are formed on the silicon substrate 1 as mask materials at the time of etching the silicon substrate. Furthermore, the silicon nitride film 12 and the silicon oxide film 11 are patterned using the resist pattern 3 (FIG. 19).

Figure 20:
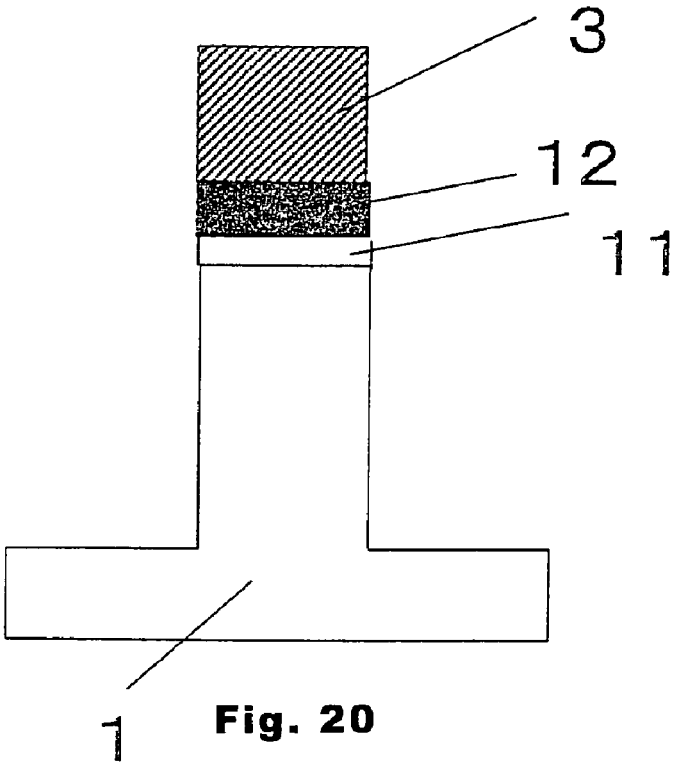

Then, as shown in FIG. 20, the entirety of the silicon substrate 1 in the region where the target device is formed is etched to a depth of approximately 120 to 500 nm except the region where the above-described mask materials remain. As a result, a pillar form structure can be formed in the silicon substrate.

Next, the resist pattern 3 is removed.

Figure 21:
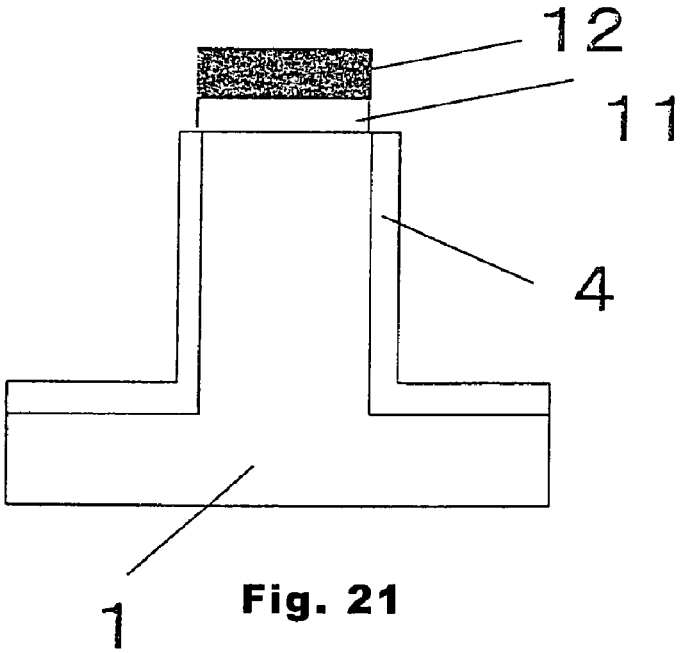

Furthermore, as shown in FIG. 21, the gate oxynitride film (silicon oxynitride film) 4 is formed by oxynitriding the silicon using the above-described Kr plasma excited by microwaves so as to have a film thickness of approximately 10 to 16 nm. This silicon oxynitride film 4 includes Kr at a area density of $10^{10}$ $cm^{-2}$ or more.

Figure 22:
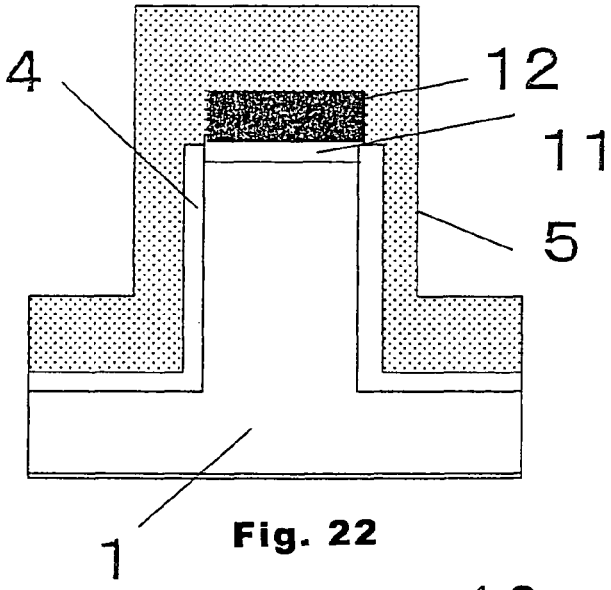

Next, the polysilicon layer 5 is deposited as shown in FIG. 22.

Figure 23:
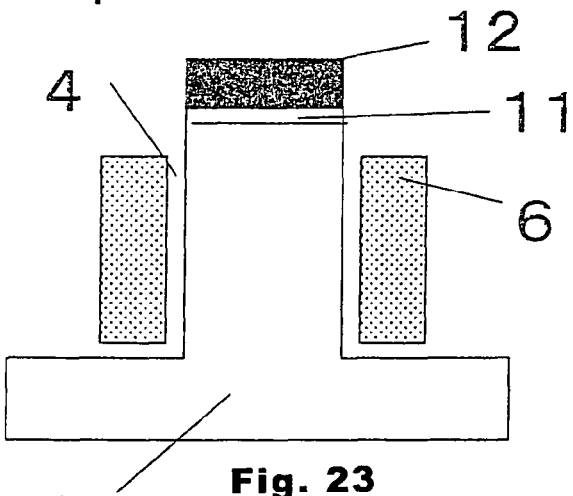

Furthermore, etching back is carried out until the surface of the above-described mask materials are completely exposed, so that the gate 6 is formed on the side walls (non-horizontal surfaces) having a pillar form structure in the silicon semiconductor as shown in FIG. 23.

After that, the ion implantation 7 is carried out under the implantation conditions of 5 to 40 KeV and 1e14 to 1e16 ions/$cm^2$ of, for example, arsenic after the removal of the silicon nitride film 13 which is a part of the mask materials. Next, annealing is carried out at 800 to 900° C. for the purpose of recovering crystal in the implantation regions, driving in and activating the implanted impurities, thereby, forming the source 8 and the drain 9 (FIG. 24). The MOS transistor of the present invention having the channel region in the non-horizontal surface is manufactured according to the above-described process.

Embodiment 5

Figure 31:
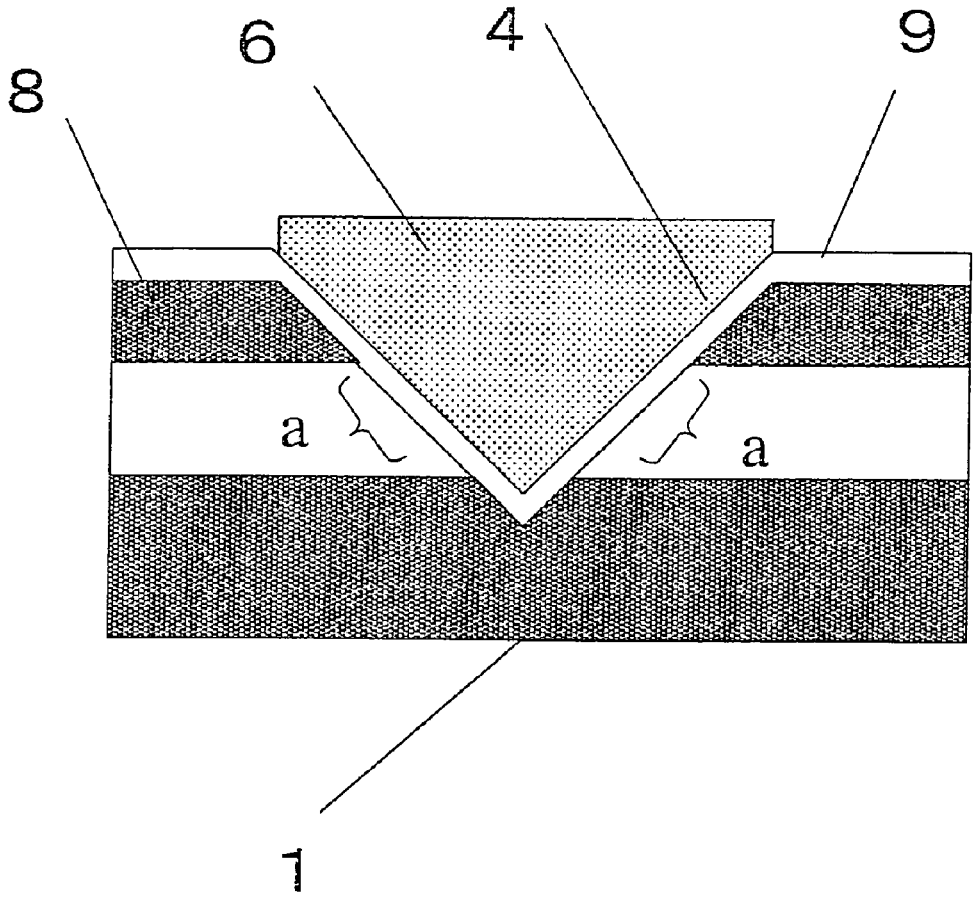
FIG. 31 is schematic cross-sectional view of a semiconductor device of the present invention.
Figure 32:
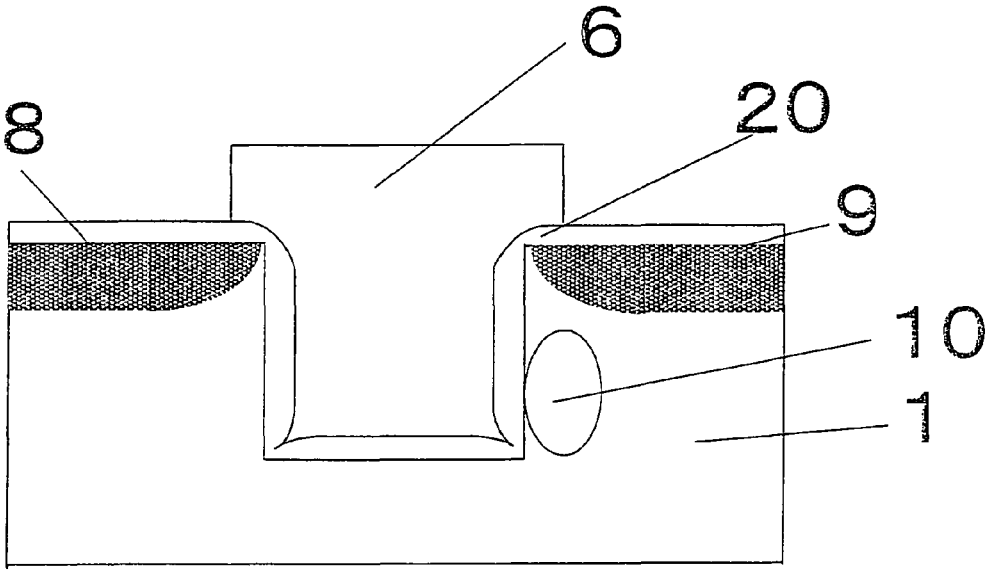
Fig. 32 Prior Art
FIG. 32 is schematic cross-sectional view of a semiconductor device of the prior art.

A forth embodiment of the semiconductor device (MOS transistor) of the present invention shown in FIG. 31 will be described below in detail. Although an example of an NMOS transistor will described below, a similar example can be obtained by replacing it with a PMOS transistor.

Figure 25:
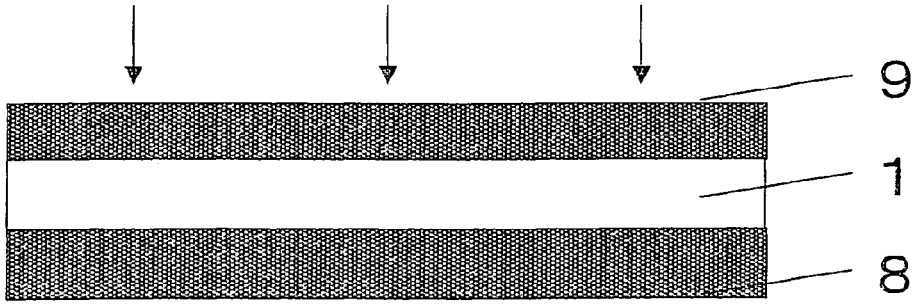

First, ion implantation is carried out on the silicon substrate 1 under the implantation conditions of 10 to 60 KeV and 5e12 to 5e13 ions/$cm^2$ of, for example, boron or $BF_2$ as shown in FIG. 25. Furthermore, the drain region 9 is formed by carrying out ion implantation under the conditions of 5 to 40 KeV and 1e14 to 1e16 ions/$cm^2$ of arsenic and the source region 8 is formed by carrying out an ion implantation under the conditions of 300 to 800 KeV and 1e13 to 5e14 ions/$cm^2$ of phosphorous or arsenic.

Figure 26:
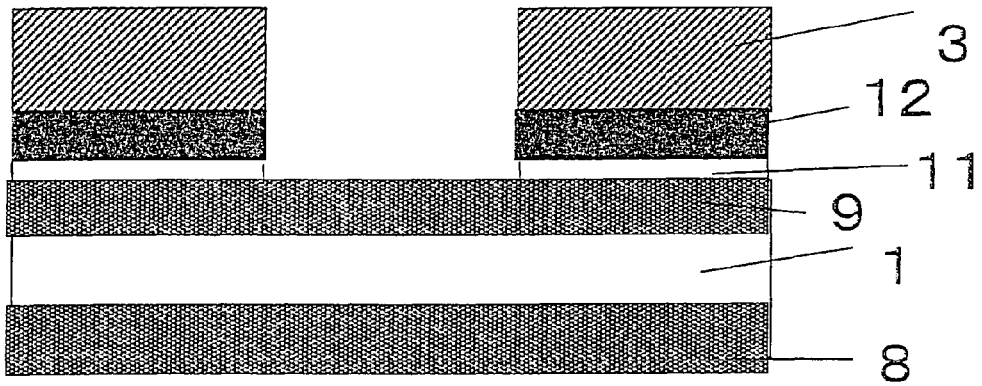

Next, the silicon oxide film 11 and the silicon nitride film 12 are formed on the silicon substrate 1 as mask materials at the time of etching the silicon substrate. Furthermore, the silicon nitride film 12 and the silicon oxide film 11 are patterned by using the resist pattern 3 (FIG. 26).

Figure 27:
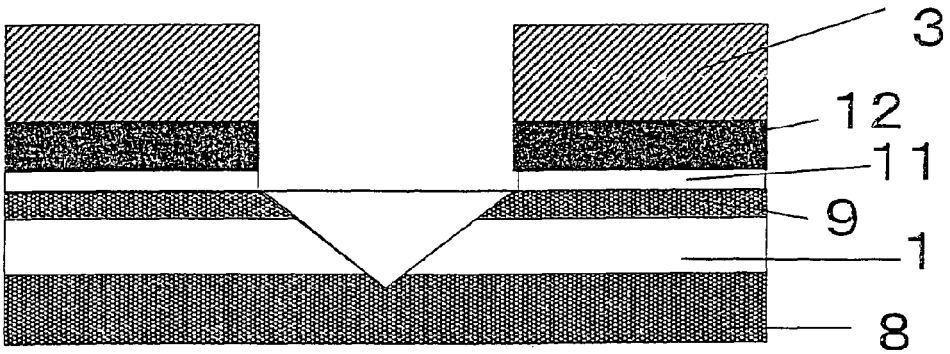

Then, as shown in FIG. 27, the silicon substrate 1 is removed through etching to a depth of approximately 120 to 500 nm by using an anisotropic etchant which makes the etching rate for the (111) plane in the silicon crystal plane direction the lowest, so that a trench in a V-shape oriented in the (111) plane is formed.

Figure 28:
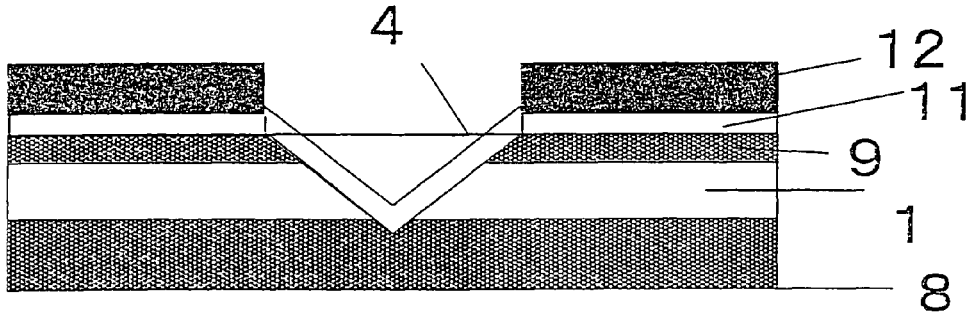

After that, the resist pattern 3 is removed. Next, as shown in FIG. 28, a gate oxynitride film (silicon oxynitride film) is formed by oxynitriding the silicon using the above-described Kr plasma excited by microwaves so as to have a film thickness of approximately 10 to 16 nm. This silicon oxynitride film 4 includes Kr at a area density of $10^{10}$ $cm^{-2}$ or more.

Figure 29:
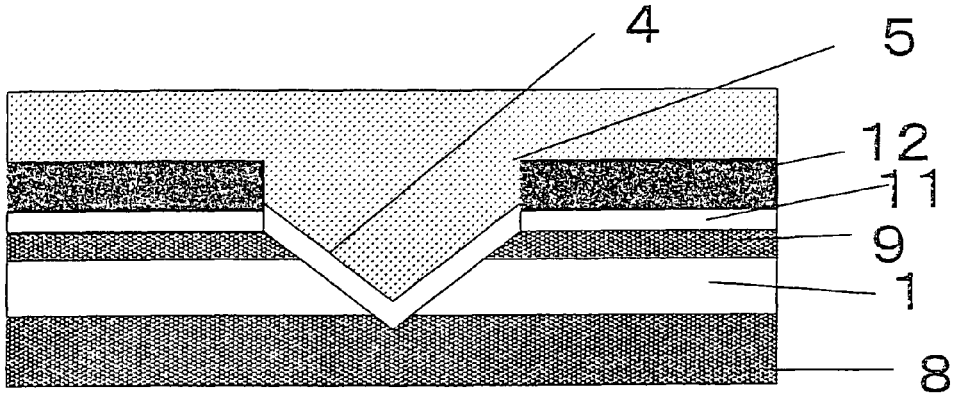

Next, the polysilicon layer 5 is filled into the trench as shown in FIG. 29.

Figure 30:
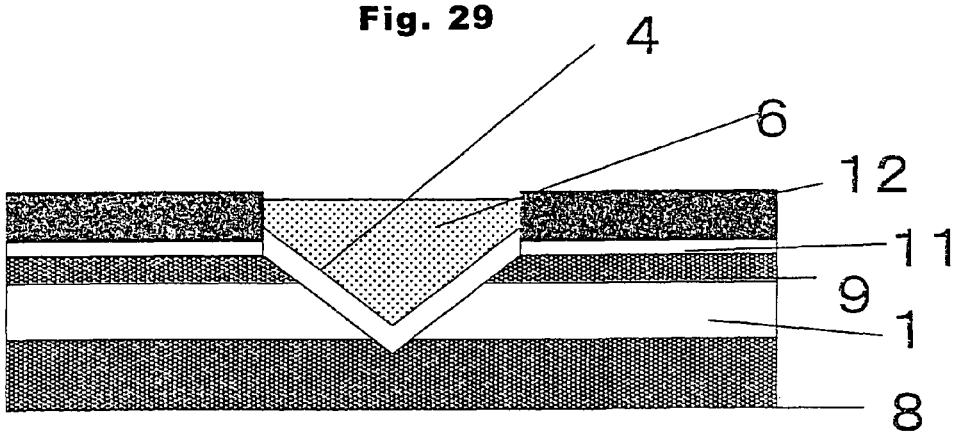

Furthermore, etching back is carried out until the surfaces of the above-described mask materials are completely exposed, so that the trench type gate 6 is formed as shown in FIG. 30. The MOS transistor of the present invention is manufactured according to the above-described process. The channel in this embodiment is formed in the area indicated by "a" in FIG. 31.

According to the present invention, it is possible to provide a semiconductor device formed on a three dimensional substrate with a step including non-horizontal surfaces, horizontal surfaces and connection regions for connecting the non-horizontal surfaces and horizontal surfaces, thereby solving serious disadvantages in characteristics of the semiconductor device, such as reduction in mobility of carriers and fluctuation in threshold voltage caused by the existence of an interface level in the non-horizontal surfaces and in the connection regions.

In addition, oxynitridation rate of the non-horizontal surfaces in the (110) plane and of the connection regions in the (111) plane in the trench form is equal to that of the horizontal surfaces in the (100) plane; therefore, an increase in the driving performance of the semiconductor device becomes possible as a result of uniformed film thickness in the entire region of the surface of the gate oxynitride film (silicon oxynitride film). In addition, the reliability of the gate oxynitride film disposing the surfaces of the substrate in the non-(100) planes such as, the (110) plane and the (111) plane can be increased to the same level as that of the horizontal surfaces in the (100) plane.

As a result of this, an increase in the driving performance of the three dimensional semiconductor device and enhanced reliability can be achieved.

What is claimed is:

1. A semiconductor device comprising:

a silicon based semiconductor channel of a field effect transistor provided with a step including a non-horizontal surface, a horizontal surface and a connection region for connecting the non-horizontal surface and the horizontal surface;

a gate insulating film formed in at least a part of the step;

a gate electrode formed on the gate insulating film, wherein the entirety or a part of the gate insulating film is formed of a silicon oxynitride film that contains a rare gas element at a area density of $10^{10}$ $cm^{-2}$ or more in at least a part of the silicon oxynitride film, and wherein the horizontal surface corresponds to a (100) plane in the silicon based semiconductor substrate, the connection regions correspond to a (111) plane in the silicon based semiconductor substrate and the non-horizontal surface corresponds to a (110) plane in the silicon based semiconductor substrate, and wherein a (100) plane and a (111) plane have an interface level density in the order of $10^{10}$ $eV^{-1}cm^{-2}$.

2. A semiconductor device according to claim 1, in which the rare gas element is Kr or Ar.

3. A semiconductor device according to claim 1, in which the silicon oxynitride film is a film formed by simultaneously oxidizing and nitriding the silicon based semiconductor substrate.

4. A semiconductor device according to claim 1, in which the silicon oxynitride film is a film formed on the silicon based semiconductor substrate in an atmosphere that includes a nitrogen gas or a compound gas containing nitrogen atom, oxygen gas and a rare gas and introduces microwaves.

5. A semiconductor device according to claim 4, in which the compound gas containing nitrogen atom is $NH_3$.

6. The semiconductor device of claim 1, wherein the gate insulating film on the step has a substantially uniform film thickness in comparison with a film thickness of a gate insulating film according to a thermal oxidation production method.

7. A semiconductor device according to claim 4, in which the silicon based semiconductor substrate has a trench comprising a pair of non-horizontal surfaces, a pair of connection regions and the horizontal surface, the gate insulating film is the silicon oxynitride film formed on the entire surface of the trench and contained the rare gas element at the area density of $10^{10}$ $cm^{-2}$ or more, the gate electrode is filled into the trench.

8. A semiconductor device comprising:

a silicon based semiconductor channel of a field effect transistor provided with a step including a non-horizontal surface, a horizontal surface and a connection region for connecting the non-horizontal surface and the horizontal surface;

a gate insulating film formed in at least a part of the step;

a gate electrode formed on the gate insulating film, wherein the entirety or a part of the gate insulating film comprises silicon oxynitride that contains a rare gas element at a area density of $10^{10}$ $cm^{-2}$ or more in at least a part of the silicon oxynitride, and wherein the horizontal surface corresponds to a (100) plane in the silicon based semiconductor substrate, the connection regions correspond to a (111) plane in the silicon based semiconductor substrate and the non-horizontal surface corresponds to a (110) plane in the silicon based semiconductor substrate, and wherein a (100) plane and a (111) plane have an interface level density in the order of $10^{10}$ $eV^{-1}$ $cm^{-2}$.

9. The semiconductor device of claim 8, wherein the gate insulating film on the step has a substantially uniform film thickness in comparison with a film thickness of a gate insulating film according to a thermal oxidation production method.

*10. A semiconductor device comprising:*

*a silicon based semiconductor channel of a field effect transistor provided with a step including a non-horizontal surface, a horizontal surface and a connection region for connecting the non-horizontal surface and the horizontal surface;*

*a gate insulating film formed in at least a part of the step;*

*a gate electrode formed on the gate insulating film,*

*wherein the entirety or a part of the gate insulating film is formed of a silicon oxynitride film containing rare gas atoms, and*

*wherein the silicon crystal plane of the horizontal surface has the specific characteristic of a (100) plane in the silicon based semiconductor substrate,*

*the silicon crystal plane of the connection region has the specific characteristic of a (111) plane in the silicon based semiconductor substrate and*

*the silicon crystal plane of the non-horizontal surface has the specific characteristic of a (110) plane in the silicon based semiconductor substrate,*

*wherein an interface level density at the interface of the connection region is approximately the same as the interface level density at the interface of the horizontal surface as a result of the silicon oxynitride film being formed by exposing the surface of the silicon based semiconductor to the plasma atmosphere of a silicon oxynitride film forming gas and rare gas, and*

*wherein a (100) plane and a (111) plane have an interface level density in the order of $10^{10}$ $eV^{-1}cm^{-2}$.*

* * * * *